US005208493A

United States Patent [19]

Lendaro et al.

[11] Patent Number: 5,208,493

[45] Date of Patent: May 4, 1993

[54] STEREO EXPANSION SELECTION SWITCH

[75] Inventors: Jeffery B. Lendaro, Noblesville; Robert E. Morris, Jr., Indianapolis, both of Ind.

[73] Assignee: Thomson Consumer Electronics, Inc., Indianapolis, Ind.

[21] Appl. No.: 693,309

[22] Filed: Apr. 30, 1991

[51] Int. Cl.[5] ...................... H04S 5/00; H03K 17/687

[52] U.S. Cl. .................................. 307/529; 307/571; 381/18

[58] Field of Search ............... 307/241, 242, 571, 572, 307/573, 582, 529, 243; 381/18

[56] References Cited

U.S. PATENT DOCUMENTS

| | | | |
|---|---|---|---|
| 3,448,293 | 6/1969 | Russell | 307/572 |
| 3,646,364 | 2/1972 | Kaminski | 307/572 |
| 3,731,116 | 5/1973 | Hill | 307/572 |
| 3,902,078 | 8/1975 | Peterson | 307/573 |
| 3,908,136 | 9/1975 | Desperques-Volmier | 307/573 |
| 3,942,039 | 3/1976 | Kikuchi et al. | 307/572 |
| 3,955,103 | 5/1976 | Russell et al. | 307/573 |
| 4,323,796 | 4/1982 | Lathrope | 307/572 |

*Primary Examiner*—John Zazworsky
*Attorney, Agent, or Firm*—Joseph S. Tripoli; Peter M. Emanuel; Frederick A. Wein

[57] ABSTRACT

A stereo expansion circuit has right and left amplifying channels for providing expanded stereo signals. A selection device comprises a switch cross coupling the signal channels for providing expanded stereo when the switch is closed. Circuitry is provided for preventing the switching control signal from being coupled to the signal channels. More specifically, a version of a signal coupled between the signal channels through the conduction channel of the switch is applied to the control input of the switch to inhibit the control signal from being coupled to the conduction channel. Such an arrangement is particularly advantageous when the switch comprises a J-FET.

2 Claims, 2 Drawing Sheets

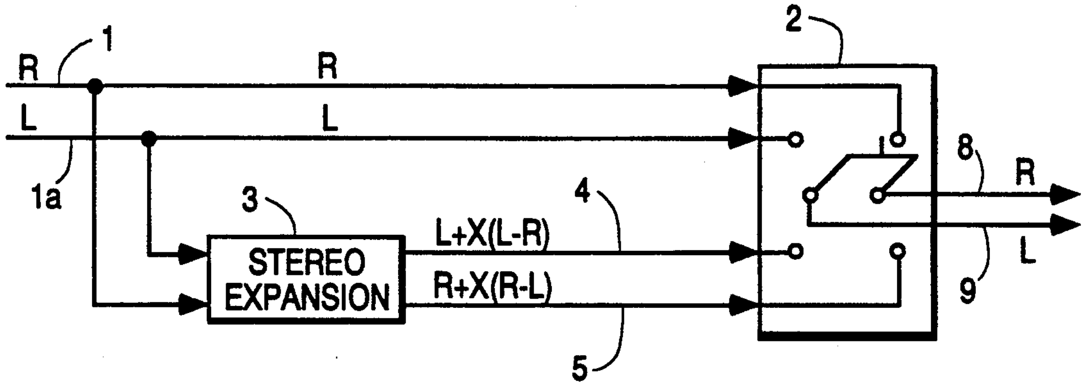
FIG. 1
PRIOR ART
FIG. 2
PRIOR ART
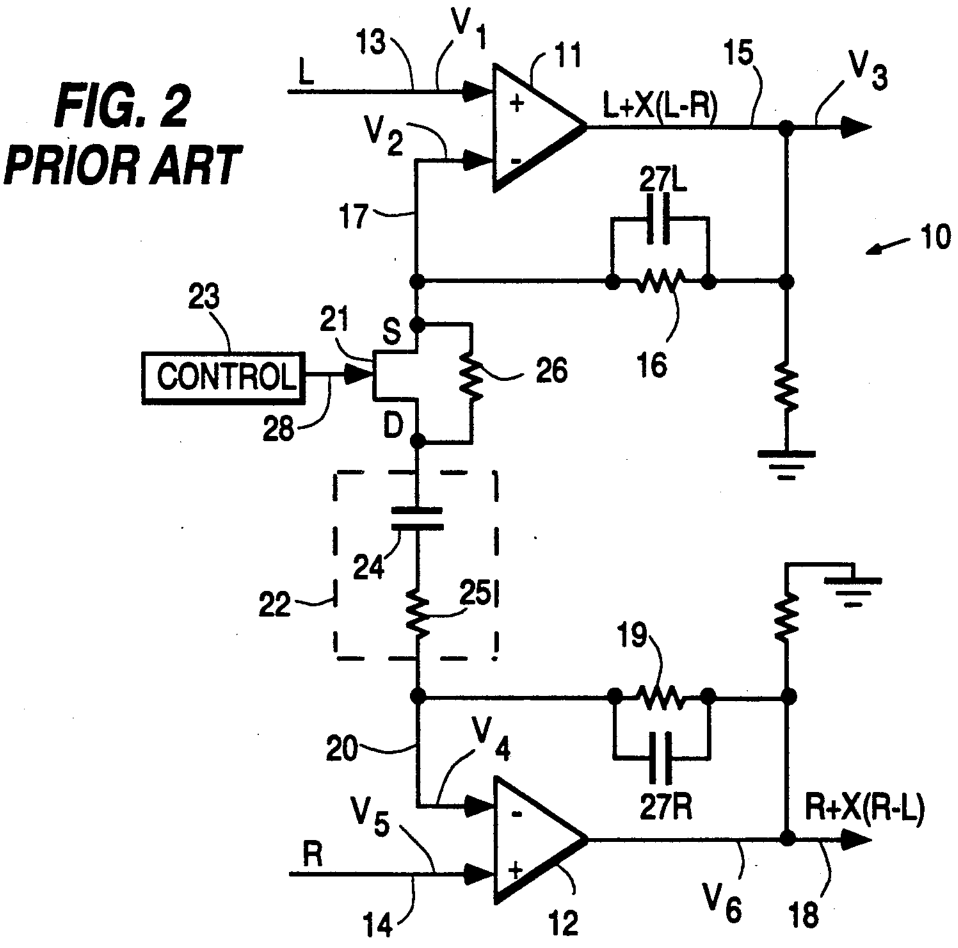

STEREO EXPANSION SELECTION SWITCH

BACKGROUND

This invention is directed to switching circuitry which may, for example advantageously be employed for selectively actuating or deactuating the stereo expansion circuitry of an audio system.

Stereo expansion in audio systems is well known in the art and has been available for many years. In such systems, the right and left channel signals are processed in a manner which makes it appear to the listener that the separation of the speakers is much greater than the actual physical separation. Stereo expansion is described in U.S. Pat. No. 4,495,637 of Bruney.

FIG. 1 is a simplified block diagram showing the selection of an expanded stereo system. The right (R) and left (L) audio signals are received on input lines 1 and 1*a* respectively. A selection switch 2 is shown as a double-pole double-throw switch for purposes of illustration. In an actual stereo receiver, the switch 2 would be an electronic switch. When expanded stereo is not desired, the switch is coupled to lines 1 and 1*a* and the R and L signals pass directly through the switch 2 to output lines 8 and 9. The input lines 1 and 1*a* are also coupled to a stereo expansion circuit 3 having output lines 4 and 5. The expansion circuit 3 combines the R and L audio signals for producing the expanded audio signals $L+X(L-R)$ and $R+X(R-L)$ which are available on output lines 4 and 5 of the expansion circuit 3.

FIG. 2 is the schematic diagram of another switching arrangement for selectively providing stereo or expanded stereo signals and will be described in detail below. Briefly, it uses a transmission gate coupled between inputs of operational amplifiers. As shown, the transmission gate may comprise a field effect transistor. Such a switch arrangement is much simpler than switch 2 shown in FIG. 1. However, the present inventor has recognized that depending on the type of FET utilized, the transmission gate itself may introduce signal distortion.

SUMMARY OF THE INVENTION

In a preferred embodiment of the invention, a stereo expansion circuit has right and left amplifying channels for providing expanded stereo signals. A selection device comprises a switch cross coupling the signal channels for providing expanded stereo when the switch is closed. Circuitry is provided for preventing the switching control signal from being coupled to the signal channels. More specifically, a version of a signal coupled between the signal channels through the conduction channel of the switch is applied to the control input of the switch to inhibit the control signal from being coupled to the conduction channel. Such an arrangement is particularly advantageous when the switch comprises a J-FET.

BRIEF DESCRIPTION OF THE DRAWINGS

FIG. 1, previously referred to, is a simplified block diagram showing a prior art stereo expansion selection system.

FIG. 2 is a schematic diagram showing a prior art stereo expansion selection system.

DETAILED DESCRIPTION OF THE PREFERRED EMBODIMENT

Figure 3:
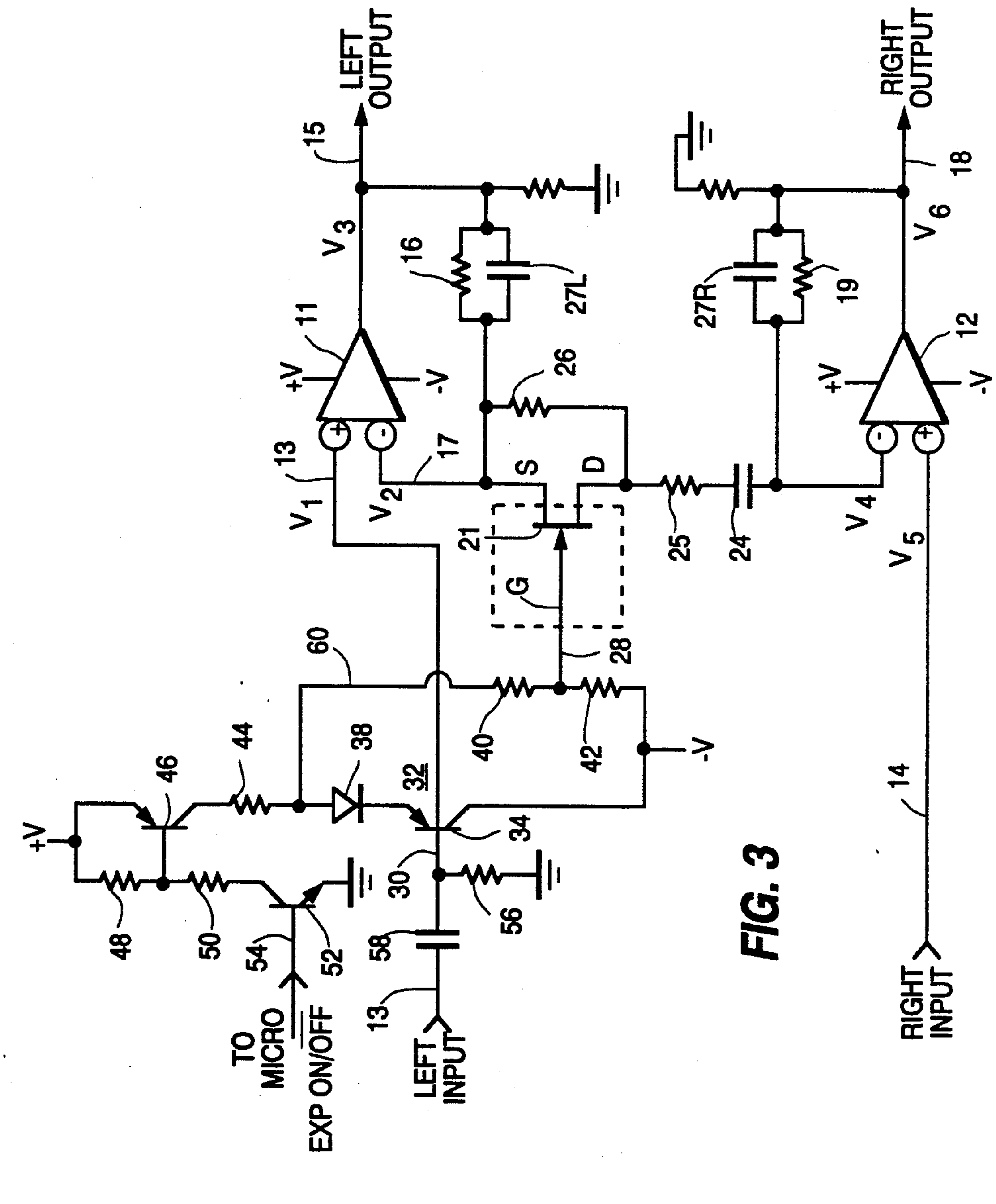
FIG. 3 is a schematic diagram of a stereo expansion circuit constructed according to aspects of the present invention.

In FIG. 2, a stereo expansion circuit 10 includes two operational amplifiers (op-amps) 11 and 12. A left (L) channel signal is applied to the positive (non-inverting) input terminal of the op amp 11 by way of an input line 13. A right (R) channel signal is applied to the positive input terminal of the op amp 12 by way of an input line 14. The left channel signal developed on output line 15 of the op amp 11 is fed back to the negative (inverting) input terminal of the op amp 11 through the parallel combination of resistor 16, a capacitor 27L, and an input line 17. The right channel signal developed on the output line 18 of the op-amp 12 is similarly fed back to the negative (inverting) input terminal of op-amp 12 through the parallel combination of a resistor 19 and capacitor 27R, and an input line 20. The negative input lines 17 and 20 of the op amps 11 and 12, respectively, are connected through a transmission gate 21, including a junction field effect transistor (FET) and a filter 22. The gate control electrode 28 of the transmission gate (field effect transistor) 21 is actuated by a control voltage source 23. The value of the control voltage from source 23 is selected on the basis of the characteristics of the transmission gate 21 and any bias voltage provided on line 17, to enable the transmission gate 21 to be fully turned "on" (conductive) and "off" (nonconductive).

In operation, when stereo expansion is not utilized, the output of the control voltage source 23 is a negative voltage (for an N-channel depletion type FET) and transmission gate 21 is nonconductive. In this situation, OP amp 11 amplifies a pure left channel signal and OP amp 12 amplifies a pure R signal. Accordingly, the stereo signals pass directly through the amplifiers 11 and 12 to other circuitry (not shown) of the stereo system and ultimately to spaced apart loudspeakers (not shown).

When stereo expansion is to be utilized in the system, the control voltage source 23 provides a less negative voltage and the transmission gate 21 (drain-source channel) is rendered conductive. When the transmission gate 21 is conductive, the inverting input lines 17 and 20 of the op amps 11 and 12 are coupled together through the filter 22. The right and left channel signals are fed back by the respective resistors 16 and 19 and the differential cross-channel coupling causes each channel output to effect the output of the other channel. Specifically, the output signal on the left output line 15 of the op amp 11 is a $L+X(L-R)$ signal while the output signal on the right output line 18 of the op amp 12 is a $R+X(R-L)$ signal. The coefficient X is determined by the characteristics of the filter 22, and typically is between one and two. When the received signal is monophonic, the R and L signals are equal and therefore the $L-R$ and $R-L$ components are not present.

Filter 22 includes a capacitor 24 and a resistor 25. The exact values for the capacitor 24 and resistor 25 are dependent upon the amount of cross coupling desired. As the coupling coefficient increases the apparent separation of the loudspeakers also increases. As the value of resistor 25 increases the cross coupling decreases. Capacitor 24 determines the crossover frequency at which coupling occurs. In the exemplary embodiment, the value of capacitor 24 is selected to cause very little coupling between channels at low frequencies, to increase the coupling as the frequency increases from about 150 Hz or 200 Hz to provide full coupling at about 1 KHz to 3 KHz, and then to decrease the coupling to virtually zero at and above 5 KHz.

A high impedance resistor 26, for example, having a resistance of 10 megohms, is shunted across the FET drain-source electrodes of transmission gate 21 in order to keep a DC voltage on capacitor 24 regardless of whether transistor 21 is "on" or "off". The high impedance 26 is used to prevent audible "pops" or switching transients from being generated when the transmission gate 21 is turned on and off, and the impedance is sufficiently high to prevent cross channel coupling when the transmission gate 21 is non-conductive. The aspects of the circuit of FIG. 2 as discussed above are shown in U.S. Pat. No. 4,831,652 of Anderson et al.

Negative feedback around op-amps 11 and 12 causes $V1=V2$ and $V4=V5$. When gate 21 is "off" (non-conducting), amplifiers 11 and 12 operate as followers. When gate 21 turns "on" (conducts), there is a current flow in resistor 25 caused by the difference between V2 and V4. To keep $V1=V2$ and $V4=V5$, this current must be directed through feedback resistors 16 and 19. The output signals at V3 and V6 are then $V6=V5\times(R19\times R25)/R25$ and $V3=V1(R16\times R25)/R25$. For the circuit of FIG. 2, the upper frequency break point for an exemplary right channel is $Fu=1/(2\pi(C27R)(R19))$ and the lower frequency break point is $F1=1/(2\pi(C24)(R25))$.

Gate 21 is typically a junction field effect transistor (JFET), and in the exemplary embodiment, is an N-channel depletion type. This type of FET transistor is fully conductive from drain to source with zero volts between gate and source, and has decreasing channel conduction between drain and source with increasing negative bias voltage applied between the gate terminal and the conductive channel. A JFET has an internal diode formed from the gate to the conductive channel such that the diode is back-biased when a negative voltage is applied to the gate for causing the channel to decrease conduction (become depleted). However, a problem can arise for large signal levels, so that due to the peak signal level appearing at either the drain or source of transistor 21, the gate of the transistor is forward biased with respect to the conductive channel when the transistor is in the conductive mode (zero volts at the gate terminal). This forward bias causes current to flow from the gate to the conductive channel and causes distortion in the system in a manner which is discussed more fully below. The stereo expander system is particularly susceptible to such a distortion effect at the signal frequencies where a graphic equalizer is used to provide boost for increasing the amplitudes of signal frequencies. For example, even at a signal level of 500 millivolts RMS, the total harmonic distortion (THD) can be as high as 6 percent due to the gate-source junction conduction.

The distortion problem manifests itself when the gate 21 is conductive for providing the stereo expansion effect. Since transistor 21 is a depletion mode FET, the gate is biased at or near zero volts with respect to the source and/or drain for the lowest conductivity resistance. In such a condition, if either of the source or drain should go sufficiently negative, the gate diode can be biased into conduction and current will flow from the gate to the conductive channel. This can occur when the left and/or right channel signal has a large negative peak, due to the feedback resistors 16 and 19 since the AC signal at the inverting inputs 17, 20 of respective amplifiers 11 and 12 follow the signal at the respective non-inverting inputs 13, 14.

The AC signal at the inverting inputs 17, 20 appears at the drain and source terminals of the channel of FET 21. When there is a conduction of the gate diode of FET 21, current flows from the gate to the conductive channel and this flow of current effects the equality of the signal voltage at the inverting and non-inverting inputs of the respective amplifiers 11, 12 (making $V1\neq V2$ and $V4\neq V5$). This inequality of input voltages between the inverting and non-inverting terminals of the op-amps 11 and 12 causes the amplifiers to distort at the high negative peak portions of the input signal.

There are four different signal conditions, i.e., left only (R=0), right only (L=0), regular stereo with simultaneous signals in both left and right channels, and monophonic. In regular stereo the signal levels are constantly changing in relationship, and by superposition, the regular stereo can be considered to be a combination of the other three signal conditions. Thus, the analysis of the different signal conditions reduces to three conditions.

Analysis will now be made of the circuit for the three different signal conditions.

If there is a left only signal (R=0), distortion is created in the left amplifier 11 because of unbalanced currents being fed to inverting input 17 from the gate through the conductive channel of FET 21. Since R=0, inverting terminal 20 and non-inverting terminal 14 of amplifier 12 are at a virtual AC ground (zero AC volts). Because the distortion at V2 is fed through gate 21 to right amplifier 12 at V4, there is also distortion in the right channel.

For a right only signal (L=0), inverting terminal 17 and non-inverting terminal 13 of left amplifier 11 are both at virtual AC ground and since the the source and the drain terminals of FET 21 have a very low resistance between them, the source and input terminals are both also at virtual AC ground. For such a case, both sides of the gate diode are essentially zero volts and there is no conduction in the diode gate since the voltage across the gate diode is less than 0.7 volts which is the threshold voltage necessary for diode conduction in silicon.

Thus, as shown for the exemplary circuit configuration, distortion is created in the left channel for a left only signal and little or no distortion is created in the right channel for a right only signal. If the RC network 24, 25 were transferred to the left channel side of FET 21, then the situation would be reversed, and the distortion would only appear on the right side. Splitting resistor 25 into two series resistors, with half the resistance coupled on each of the drain and source of FET 21, would reduce the problem since the flow of currents would be lower. However, the problem would not be cured and there would still be a problem for a monophonic signal. It is not desirable to similarly split capacitor 24 into two capacitors because this would mean that the drain-source channel of transistor 21 would be totally removed from any DC ground and would be floating.

With a monophonic signal, both inverting terminals 17 and 20 simultaneously go negative the same amount. Thus, there is no voltage difference between them and there is no current flow between the terminals. However, there is still current injected from the gate terminal 28 as discussed above and this current must go somewhere. Since there is no low impedance path for this current to flow, the injected current goes to both inverting terminals 17 and 20 causing distortion in both channels.

Thus, to solve the distortion problem discussed above, reference is made to FIG. 3 wherein members corresponding to those shown in FIG. 2 have been given like numeral designations. Briefly, in the circuit of FIG. 3, a version of the signal which appears at the source-drain channel of FET 21 is also provided, in phase, to the gate terminal 28 In this way, if a peak negative going signal would appear at the source terminal (left channel) which would be sufficiently large to forward bias the gate terminal 28, a version of this AC signal is also applied to the gate terminal so that the bias condition between the gate and source/drain electrodes is not effected. This is accomplished as follows.

The left channel input signal 13, in addition to being applied to the non-inverting input of amplifier 11, is also applied to a base electrode 30 of emitter follower PNP transistor 32, which has a collector electrode 34 coupled to a minus voltage supply and an emitter electrode 36 coupled to the cathode of a diode 38. The anode of diode 38, coupled to a resistor divider including resistors 40 and 42 is coupled to the minus voltage supply. The junction of resistors 40 and 42, is coupled to the gate electrode 28 of FET 21. The anode of diode 38 is also coupled through a resistor 44 to a collector electrode of PNP transistor 46 having an emitter electrode coupled to a plus voltage supply. A base electrode of transistor 46 is coupled to the junction of a resistor divider including resistors 48 and 50 coupled between the plus voltage supply and a collector electrode of a transistor 52. Transistor 52 has an emitter electrode coupled to ground and a base electrode coupled to a microprocessor or other status signal source (not shown) for providing a signal for switching the stereo expander circuit "on" and "off".

Transistor 32 operates as an emitter follower for the left channel signal. Diode 38, in series with the base-emitter junction of transistor 32, increases the breakdown voltage of the base-emitter junction. With the circuit in the "off" position (no stereo expansion) transistors 52, 46, and 32 are non-conducting and FET gate 28 is pulled-down to minus voltage supply by resistor 42. With a positive voltage applied to the base electrode of transistor 52 (expansion "on") transistor 52 conducts and forward biases transistor 46 so that it will also conduct. Conduction of transistor 46 applies the plus supply voltage to the emitter electrode of transistor 32 via resistor 44 and diode 38 so that transistor 32 is operative and will amplify. In the amplification mode, follower transistor 32 will provide an "in phase" L signal across resistors 40, 42 with the signal level at gate 28 being reduced in amplitude due to the voltage division of resistors 40, 42. Simultaneously with the activation of transistor 32, the DC bias applied to gate 28 is changed from the minus supply voltage to approximately zero volts bias. This is because the base electrode of transistor 32 is returned to ground through resistor 56 and the signal source at input 13 coupled to the base electrode is AC coupled through capacitor 58. The DC voltage at junction 60 is approximately +1.4 volts above ground (+0.7 volts for the Vbe of transistor 32 and +0.7 volts for diode 38). The voltage division of resistors 40, 42 brings the DC voltage at gate 28 back to approximately zero volts with respect to ground. Thus, the DC bias voltage applied to gate 28 of FET 21 is changed from a high negative voltage which "pinches off" the drain-source conducting channel of FET 21 to close to zero volts permitting maximum drain-source conduction. This conduction in the source-drain channel turns the expansion circuit "on" while a slightly reduced version of the left AC signal is also applied to gate 28 so that the AC signal at gate 28 will approximately follow any AC signal appearing at the source electrode thus preventing gate 28 from being forward biased by a peak negative AC signal at the source electrode.

It should be noted that a signal follower is not provided for the right channel since it is not necessary to operate on the right channel for the reasons explained above in the discussion of the cause of the distortion. Similarly for the monophonic case where L=R, as explained above in the discussion of the cause of the distortion, operation on the left channel only also corrects the problem.

What is claimed is:

1. An arrangement including first and second channels having respective first and second amplifiers, each amplifier having respective non-inverting and inverting input terminals and an output terminal, one of said input terminals receiving an input signal, and a feedback path connected between the output terminal and the other of said input terminals, switch means coupled between the other said input terminals of said first and second amplifiers for coupling a first signal from the first channel to the second channel and coupling a signal from the second channel to the first channel when said switch means is closed, said switch means comprising a transmission gate having a control input coupled to a control signal for actuating the transmission gate, control means for generating said control signal, and means for coupling a version of one of the first and second channel signals to said control input of said switch means.

2. The amplifier circuit of claim 1 wherein the first and second channels are stereophonic audio channels.

* * * * *